(12) United States Patent
Lee et al.

(10) Patent No.: US 10,079,351 B2
(45) Date of Patent: Sep. 18, 2018

(54) METHOD OF PREPARING ORGANIC ELECTRONIC DEVICE

(71) Applicant: LG DISPLAY CO., LTD., Seoul (KR)

(72) Inventors: Sang Jun Lee, Daejeon (KR); Jun Rye Choi, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 292 days.

(21) Appl. No.: 14/777,082

(22) PCT Filed: Sep. 30, 2014

(86) PCT No.: PCT/KR2014/009238
§ 371 (c)(1),
(2) Date: Sep. 15, 2015

(87) PCT Pub. No.: WO2015/047053
PCT Pub. Date: Apr. 2, 2015

(65) Prior Publication Data
US 2016/0035988 A1    Feb. 4, 2016

(30) Foreign Application Priority Data

Sep. 30, 2013 (KR) .................. 10-2013-0116356
Dec. 10, 2013 (KR) .................. 10-2013-0153462
Sep. 30, 2014 (KR) .................. 10-2014-0131985

(51) Int. Cl.
*H01L 51/00*    (2006.01)
*B32B 27/08*    (2006.01)
*B32B 27/28*    (2006.01)
*B32B 3/30*    (2006.01)
*H01L 51/56*    (2006.01)

(52) U.S. Cl.
CPC ............ *H01L 51/0097* (2013.01); *B32B 3/30* (2013.01); *B32B 27/08* (2013.01); *B32B 27/283* (2013.01); *H01L 51/003* (2013.01); *B32B 2457/206* (2013.01); *H01L 51/004* (2013.01); *H01L 51/56* (2013.01); *H01L 2251/10* (2013.01); *H01L 2251/5338* (2013.01); *Y02E 10/549* (2013.01); *Y02P 70/521* (2015.11)

(58) Field of Classification Search
CPC .................................................. H01L 51/0097
See application file for complete search history.

(56) References Cited

U.S. PATENT DOCUMENTS

| | | | |
|---|---|---|---|
| 4,720,432 A | 1/1988 | VanSlyke et al. | |
| 2006/0280961 A1* | 12/2006 | Yamada | B32B 3/085 428/671 |
| 2008/0113283 A1* | 5/2008 | Ghoshal | B82Y 10/00 430/22 |

(Continued)

FOREIGN PATENT DOCUMENTS

| | | |
|---|---|---|
| CN | 102231359 A | 11/2011 |
| CN | 102969251 A | 3/2013 |

(Continued)

*Primary Examiner* — Robert A Vetere
(74) *Attorney, Agent, or Firm* — Dentons US LLP

(57) ABSTRACT

A method of preparing an organic electronic device, an organic electronic device prepared using the same, and a use thereof are provided. For example, the method of effectively preparing an organic electronic device using a flexible substrate, the organic electronic device prepared using the same, and the use thereof may be provided.

9 Claims, 3 Drawing Sheets

(56) References Cited

U.S. PATENT DOCUMENTS

| | | | |
|---|---|---|---|
| 2009/0115321 A1* | 5/2009 | Hayashi | H01L 51/5246 313/504 |
| 2012/0156457 A1 | 6/2012 | Kondo | |
| 2012/0235315 A1* | 9/2012 | Wu | H01L 21/6835 264/104 |
| 2012/0263945 A1 | 10/2012 | Yoshikawa | |
| 2013/0072079 A1 | 3/2013 | Tang et al. | |
| 2014/0077340 A1* | 3/2014 | Wang | H01L 21/48 257/618 |

FOREIGN PATENT DOCUMENTS

| | | |
|---|---|---|
| CN | 103000587 A | 3/2013 |
| EP | 2374766 A1 | 10/2011 |
| JP | 2-088689 A | 3/1990 |
| JP | 2-191694 A | 7/1990 |
| JP | 2-196885 A | 8/1990 |
| JP | 2-250292 A | 10/1990 |
| JP | 2-255789 A | 10/1990 |
| JP | 2-289676 A | 11/1990 |
| JP | 3-296595 A | 12/1991 |
| JP | 4-096990 A | 3/1992 |
| JP | 5-009470 A | 1/1993 |
| JP | 5-017764 A | 1/1993 |
| JP | 5-202011 A | 8/1993 |
| JP | 6-049079 A | 2/1994 |
| JP | 6-088072 A | 3/1994 |
| JP | 6-092947 A | 4/1994 |
| JP | 6-100857 A | 4/1994 |
| JP | 6-107648 A | 4/1994 |
| JP | 6-132080 A | 5/1994 |
| JP | 6-145146 A | 5/1994 |
| JP | 6-203963 A | 7/1994 |
| JP | 6-206865 A | 7/1994 |
| JP | 6-207170 A | 7/1994 |
| JP | 6-279322 A | 10/1994 |
| JP | 6-279323 A | 10/1994 |
| JP | 6-293778 A | 10/1994 |
| JP | 7-157473 A | 6/1995 |
| JP | 7-179394 A | 7/1995 |
| JP | 7-228579 A | 8/1995 |
| JP | 7-278124 A | 10/1995 |
| JP | 8-022557 A | 1/1996 |
| JP | 8-081472 A | 3/1996 |
| JP | 2597377 B2 | 4/1997 |
| JP | 2007-173811 A | 7/2007 |
| JP | 2010-034496 A | 2/2010 |
| JP | 2012-060103 A | 3/2012 |
| JP | 2012-091369 A | 5/2012 |
| JP | 2013-504144 A | 2/2013 |
| JP | 2013-135180 A | 7/2013 |
| KR | 10-2009-0036427 A | 4/2009 |
| KR | 10-2011-0015304 A | 2/2011 |
| KR | 10-2012-0027632 A | 3/2012 |
| KR | 10-2012-0106659 A | 9/2012 |
| KR | 10-2013-0072651 A | 7/2013 |
| TW | 200405130 A | 4/2004 |
| TW | 200522810 A | 7/2005 |
| WO | 2011/024690 A1 | 3/2011 |

\* cited by examiner

METHOD OF PREPARING ORGANIC ELECTRONIC DEVICE

This application is a National Stage Application of International Application No. PCT/KR2014/009238, filed on Sep. 30, 2014, which claims the benefit of Korean Patent Application No. 10-2013-0116356, filed on Sep. 30, 2013, Korean Patent Application No. 10-2013-0153462, filed on Dec. 10, 2013 and Korean Patent Application No. 10-2014-0131985, filed on Sep. 30, 2014, all of which are hereby incorporated by reference in their entirety for all purposes as if fully set forth herein.

FIELD

The present application relates to a method of preparing an organic electronic device, an organic electronic device prepared using the same, and a use thereof.

BACKGROUND

An organic electronic device (OED) refers to a device that includes at least one layer of an organic material capable of conducting an electric current. Kinds of the OED include an organic light emitting diode (OLED), an organic solar cell, an organic photoconductor (OPC), or organic transistor, etc.

A typical organic electronic device is generally prepared on a rigid substrate such as glass. For these types of rigid elements, research on a flexible element having a flexible substrate has been conducted instead of a typical glass substrate. Flexible substrates may be mainly classified into three types: a thin-film glass substrate, a metal foil substrate, and a plastic substrate.

A method of preparing an element using a flexible substrate requires special attention due to flexibility of the flexible substrate even when the flexible substrate has rigidity substantially similar to that of the rigid substrate. As the method using the flexible substrate, there is a method including attaching a flexible substrate to a hard carrier substrate, performing subsequent processes and peeling off elements from the carrier substrate (for example, see the patent document 1). In such a method, after a proper adhesive material is formed on an edge region of the carrier substrate attached to the flexible substrate, a process of removing the edge region is generally performed to finally peel off the flexible substrate. Therefore, the method has a problem in that preparation efficiency may be degraded due to the presence of such a process, and the elements may be damaged while peeling off of the substrate when the adhesive material is not properly removed.

PRIOR ART DOCUMENT

Patent Document

PATENT DOCUMENT 1: Korean Unexamined Patent Application Publication No. 2013-0072651

DESCRIPTION

Object

The present application is directed to providing a method of preparing an organic electronic device, an organic electronic device prepared using the same, and a use thereof. For example, one major object of the present application is to provide a method of preparing an organic electronic device effectively using a flexible substrate, an organic electronic device prepared using the same, and a use thereof.

Solution

One aspect of the present application provides a method of preparing an organic electronic device, which includes forming a polymer layer on a carrier substrate, disposing a flexible substrate on the polymer layer, and forming an organic electronic element on the substrate. The preparation method may further include peeling off the flexible substrate from the polymer layer after the above-described operations.

In the foregoing, the carrier substrate serves to support the flexible substrate or the organic electronic element during an operation of preparing or transporting the organic electronic element. Various types of substrates may be used as such a carrier substrate without particular limitation as long as they can serve as the proper support such as a rigid substrate. For example, a glass substrate may be used as the substrate, but the present application is not limited thereto. For example, various rigid substrates may be applied as the carrier substrate.

In the preparation method according to one illustrative embodiment of the present application, a polymer layer is formed on such a carrier substrate. The flexible substrate is attached onto the carrier substrate during a preparation or transportation operation to exhibit proper adhesive strength. In this case, the polymer layer may serve to easily peel off the flexible substrate during a subsequent peeling operation.

Materials of the polymer layer are not particularly limited as long as they can serve as described above. One example of the material may include a polyorganosiloxane. The polyorganosiloxane has an advantage to easily control adhesive strength to other components by controlling the curing conditions, adjusting its own shape, or adding an additive.

Specific types of the polyorganosiloxane may be chosen in consideration of a purpose, but the present application is not particularly limited thereto.

For example, a compound including a repeating unit represented by the following Formula 1 may be used as the polyorganosiloxane.

[Formula 1]

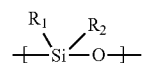

In Formula 1, $R_1$ and $R_2$ are each independently hydrogen, an alkyl group, an alkenyl group, or an aryl group.

Unless particularly defined otherwise in this specification, the term "alkyl group" may refer to an alkyl group having 1 to 20 carbon atoms, 1 to 16 carbon atoms, 1 to 12 carbon atoms, 1 to 8 carbon atoms, or 1 to 4 carbon atoms. The alkyl group may be linear, branched, or cyclic. Also, the alkyl group may be optionally substituted with one or more substituents.

Unless particularly defined otherwise in this specification, the term "alkenyl group" may refer to an alkenyl group having 2 to 20 carbon atoms, 2 to 16 carbon atoms, 2 to 12 carbon atoms, 2 to 8 carbon atoms, or 2 to 4 carbon atoms. The alkenyl group may be linear, branched, or cyclic, and may be optionally substituted with one or more substituents.

Unless particularly defined otherwise, the term "aryl group" may refer to a monovalent residue derived from a compound or a derivative thereof, which includes a benzene ring or has a structure in which two or more benzene rings are joined together or in which two or more benzene rings are condensed or joined together while sharing one or two or more carbon atoms. In general, a category of the term "aryl group" disclosed in this specification may include an aralkyl group or an arylalkyl group in addition to the functional groups normally referred to as aryl groups. The aryl group may be, for example, an aryl group having 6 to 25 carbon atoms, 6 to 21 carbon atoms, 6 to 18 carbon atoms, or 6 to 12 carbon atoms. Examples of the aryl group that may be used herein may include a phenyl group, a dichlorophenyl, a chlorophenyl, a phenylethyl group, a phenylpropyl group, a benzyl group, a tolyl group, a xylyl group, or a naphthyl group.

In the polyorganosiloxane having such a backbone, a polymer layer having desired physical properties may be formed by adjusting the kind and ratio of the functional groups ($R_1$ and $R_2$), when necessary.

For example, in the functional groups, hydrogen or an alkenyl group is a functional group which can take part in a curing reaction of the polyorganosiloxane. Thus, desired physical properties may be ensured by adjusting the kind and ratio of the functional groups so as to adjust a degree of cure.

Specific types of the polyorganosiloxane having the same backbone as in Formula 1 are not particularly limited. For example, a polydialkylsiloxane widely known as polydimethylsiloxane in the related art may be used.

In the present application, the polymer layer formed on the carrier substrate may be formed so that the polymer layer has a proper convex portion. As a result, the polymer layer may serve to maintain the flexible substrate properly, and simultaneously remove the flexible substrate easily upon removal of the substrate. Also, unlike conventional techniques, since the convex portion is properly formed, an operation of removing a portion of the substrate may not be necessarily performed upon removal of the substrate.

That is, the contact area between the flexible substrate and the polymer layer may be properly adjusted by such as convex portion, and thus the above-described effects may be achieved.

A method of forming an uneven structure as in the polymer layer is not particularly limited. For example, the polymer layer may be formed by forming a layer of a curable polymer composition on a carrier substrate, and curing the layer of the curable polymer composition in a state in which the layer of the curable polymer composition comes in contact with a mold. FIG. 1 is a diagram schematically showing such a method. Here, the carrier substrate 101, the layer 102 of the curable polymer composition, and the mold 103 are formed in a sequential manner. The curable polymer composition that may be used in the method is not particularly limited.

In the related art, various materials such as, for example, an addition-curable silicon-based material, a condensation- or polycondensation-curable silicon-based material, a UV-curable silicon-based material, or a peroxide-vulcanized silicon-based material are known as the material that can be cured to form a polymer layer including the polyorganosiloxane, and proper types of the materials may be chosen in consideration of processability.

In the polymer layer formed using such a method, the shape of the convex portion is not particularly limited, and may be designed in consideration of adhesion to the flexible substrate. FIG. 2 is a schematic diagram showing a shape of the convex portion 1022 having an uneven shape, that is, a region of the convex portion 1022 coming in contact with the flexible substrate. Regions indicated by oblique lines in the drawing may come in contact with the substrate. However, the shape of the convex portion 1022 is merely one illustrative embodiment of the present application, and various modifications may be made to the specific shapes of the convex portion 1022.

Such a shape of the convex portion may be regulated to ensure maintenance power required after contact with the flexible substrate, or peel strength required during a peeling operation. For example, the shape of the convex portion may be regulated so that the contact area between the polymer layer and the substrate is in a range of 10 to 95%, based on the total area of the polymer layer. According to another illustrative embodiment, the contact area may be greater than or equal to approximately 20%, approximately 30%, approximately 40%, or approximately 45%. Also, according to still another illustrative embodiment, the contact area may be less than or equal to approximately 90%, approximately 85%, approximately 80%, approximately 75%, approximately 70%, approximately 65%, or approximately 60%. When the contact area is excessively lower than this specified range, it may be difficult to ensure a supporting force required during an operation of preparing or transporting an organic electronic element. On the other hand, when the contact area is excessively greater than this specified range, the elements may be damaged during an operation of peeling off the substrate.

The aspect ratio of the convex portion may be adjusted to achieve the desired effects. In the present application, the aspect ratio of the convex portion is a ratio (W/H) of a width (W) of the convex portion to a height (H) of the convex portion. The width (W) and the height (H) are schematically shown in FIG. 1. In the foregoing, the height of the convex portion may refer to a height of a region in which the convex portion extrudes from the polymer layer, as shown in FIG. 1. The width (W) and the height (H) may be adjusted so that the aspect ratio (W/H) is in a range of 0.0001 to 10,000. According to another illustrative embodiment, the aspect ratio may be greater than or equal to approximately 0.001, approximately 0.01, approximately 0.1, approximately 1, approximately 10, approximately 20, approximately 30, approximately 40, approximately 50, approximately 60, approximately 70, approximately 80, approximately 90, or approximately 100. According to still another illustrative embodiment, the aspect ratio may be less than or equal to approximately 1,000, approximately 900, approximately 800, approximately 700, approximately 600, approximately 500, approximately 400, approximately 300, approximately 200, or approximately 150. When the aspect ratio is excessively lower or greater than this specified range, the elements may be damaged during an operation of peeling off the substrate, or it may be difficult to ensure a supporting force required during an operation of preparing or transporting an organic electronic element.

After such an operation, the flexible substrate is disposed on the polymer layer, followed by preparing an organic electronic device.

FIG. 3 is a diagram showing that a flexible substrate 302 is disposed on a polymer layer 301 formed as described above.

In the foregoing, the type of the substrate to be applied is not particularly limited. For example, substrates known in the related art to be used to realize a flexible element may be used as the flexible substrate. Representative examples of such a substrate include a thin-film glass film, or a polymer film. Examples of the glass film may include a film formed of at least one selected from the group consisting of soda lime glass, barium/strontium-containing glass, lead glass, aluminosilicate glass, borosilicate glass, barium borosilicate glass, and quartz, and examples of the polymer film may include a film including at least one selected from the group consisting of polyimide (PI), polyethylene naphthalate (PEN), polycarbonate (PC), acrylic resin, poly(ethylene terephthatle) (PET), poly(ether sulfide) (PES), and polysulfone (PS), but the present application is not limited thereto.

A light-transmitting film may be used as the substrate. In this specification, the term "light-transmitting film" may, for example, refer to a film having a transmittance of 50% or more, 60% or more, 70% or more, or 80% or more with respect to a portion or all of light with a visible light range. The substrate may be a thin film transistor (TFT) substrate including a driving TFT.

The substrate may have a refractive index of approximately 1.5 or more, approximately 1.6 or more, approximately 1.7 or more, or approximately 1.75 or more. Unless particularly defined otherwise in this specification, the term "refractive index" refers to a refractive index measured for light having a wavelength of approximately 550 nm. When the organic electronic device is an organic light-emitting device, this range of the refractive index of the substrate may be desirable to enhance luminance efficiency of the device. An upper limit of the refractive index of the substrate is not particularly limited, and may, for example, be approximately 2.0.

The thickness of the substrate is not particularly limited, and may be selected within a proper range in consideration of desired performance, for example, flexibility, light extraction efficiency, or a barrier property. For example, the thickness of the substrate may be in a range of approximately 10 μm to approximately 50 μm, or approximately 20 μm to approximately 30 μm.

As described above, the organic electronic element may be formed on the substrate. FIG. 4 is a diagram schematically showing that an organic electronic element 401 is formed on the substrate 302. In this case, a method of forming the organic electronic element is not particularly limited, and may be performed using methods known in the related art. For example, the preparation method may at least include forming a first electrode layer, an organic layer and a second electrode layer on the substrate.

When necessary, when the flexible substrate is particularly a polymer film, the preparation method may further include forming an inorganic material layer on the substrate prior to formation of the first electrode layer.

In this specification, the term "inorganic material layer" may, for example, refer to a layer including an inorganic material at 50% by weight or more, or 60% by weight. The inorganic material layer may include only an inorganic material, or may include other components such as an organic material when the inorganic material layer includes the inorganic material within this content range. For example, the inorganic material layer may be a barrier layer. In this specification, the term "barrier layer" may refer to a layer capable of preventing, inhibiting or relieving penetration of an external factor, such as moisture or humidity, which may have a negative influence on performance of the elements such as the organic layer. For example, the barrier layer may be a layer having a water vapor transmission rate (WVTR) of $10^{-4}$ g/m$^2$/day or less. In this specification, the WVTR may be a value which may be measured under conditions of 40° C. and 90% relative humidity using a measuring machine (for example, PERMATRAN-W3/31, MOCON, Inc.).

The barrier layer may be formed of a material known to be able to relieve, prevent or inhibit penetration of external factors such as moisture, and oxygen. Such a material may include a metal such as In, Sn, Pb, Au, Cu, Ag, Al, Ti, and Ni; a metal oxide such as TiO, $TiO_2$, $Ti_3O_3$, $Al_2O_3$, MgO, SiO, $SiO_2$, GeO, NiO, CaO, BaO, $Fe_2O_3$, $Y2O_3$, $ZrO_2$, $Nb_2O_3$, and $CeO_2$; a metal nitride such as SiN; a metal oxynitride such as SiON; or a metal fluoride such as $MgF_2$, LiF, $AlF_3$, and $CaF_2$, and also may include other materials known as a moisture-absorbent material having an absorption rate of 1% or more, or a moisture-proof material having an absorption coefficient of 0.1% or less.

The inorganic material layer may have a single-layered structure, or a multi-layered structure. The multi-layered structure may include a structure in which a homogeneous or heterogeneous inorganic material layer is stacked, or a structure in which an inorganic material layer and an organic layer are stacked. For example, when the multi-layered structure is formed using the inorganic material layer as the barrier layer, all the respective layers should not be necessarily formed of a material having a barrier property. When the finally formed multi-layered structure may show a desired barrier property, a portion of the multi-layered structure may also be formed as a layer having no barrier property. In an aspect of preventing propagation of defects such as pin holes that may occur during formation of the inorganic material layer, it may be desirable that the inorganic material layer has the multi-layered structure. Also, the barrier layer having the multi-layered structure may be desirably used to form a barrier layer having an ensured refractive index as will be described below.

An inorganic material layer having a small difference in refractive index with respect to the base film may be properly used as the inorganic material layer. For example, the absolute value of the difference in refractive index between the inorganic material layer and the base film may be less than or equal to approximately 1, approximately 0.7, approximately 0.5, or approximately 0.3. Therefore, when the base film has a high refractive index as described above, the inorganic material layer may have a refractive index equivalent to that of the base film. For example, the refractive index of the inorganic material layer may be greater than or equal to approximately 1.5, approximately 1.6, approximately 1.7, or approximately 1.75. When the organic electronic device is an organic light-emitting device, this range of the refractive index of the base film may be desirable to enhance luminance efficiency of the device. An upper limit of the refractive index of the inorganic material layer is not particularly limited, and may, for example, be approximately 2.0.

For example, the inorganic material layer may have a stacking structure of a first sub-layer and a second sub-layer. The two or more stacking structures may also be formed.

According to one illustrative embodiment, the first sub-layer may have a first refractive index, and the second sub-layer may have a second refractive index. When such sub-layers are stacked, it may be desirable to adjust the refractive index of the inorganic material layer within the above-described range while ensuring a decoupling effect. The absolute value of the difference between the first refractive index and the second refractive index may, for example, be in a range of 0.1 to 1.2. The ranges of the respective first and second refractive indexes are not particularly limited as long as the ranges of the refractive indexes are ensured. For example, the refractive index of the first sub-layer may be in a range of 1.4 to 1.9, and the refractive index of the second sub-layer may be in a range of 2.0 to 2.6. Each of the first and second sub-layers may be a metal oxide layer. For example, a suitable material to form the first sub-layer having such a refractive index includes $Al_2O_3$, and the like, and a suitable material to form the second sub-layer includes $TiO_2$, and the like. However, other various materials may be applied as long as the respective first and second sub-layers have the above-described refractive indexes, and the final stacking structure may have a barrier property as well.

The thickness of the inorganic material layer is not particularly limited, and may be properly selected according to a desire purpose. For example, the thickness of the inorganic material layer may be in a range of approximately 5 nm to approximately 60 nm, or approximately 10 nm to approximately 55 nm. When the inorganic material layer has a multi-layered structure, the thickness of each sub-layer in the multi-layered structure may, for example, be in a range of approximately 0.5 nm to approximately 10 nm, or approximately 0.5 nm to approximately 5 nm.

The conditions used to form the inorganic material layer may be adjusted to achieve desired performance, for example, an excellent barrier property or refractive index. For example, the inorganic material layer may be formed on a flat plane, for example, a plane having a surface roughness (RMS: Root Mean Square) of 5 nm or less, 4.5 nm or less, 4.0 nm or less, 3.5 nm or less, 3.0 nm or less, 2.5 nm or less, 2.0 nm or less, 1.5 nm or less, 1.0 nm or less, or 0.5 nm or less. When the inorganic material layer is formed on such a flat plane, film qualities of the formed layer may be further improved. The surface roughness may be adjusted using a material having excellent flatness per se, or may be adjusted by means of a buffer layer to be described below. Another method of ensuring desired performance, for example, a barrier property, is a method of regulating a temperature during formation of the inorganic material layer. In general, the inorganic material layer may be formed using a physical or chemical vapor deposition method. In this operation, when a deposition temperature may be regulated to a high temperature, for example, a temperature of 200° C. or higher, an excellent barrier property may be ensured.

The inorganic material layer may be formed using a deposition method such as physical vapor deposition (PVD) such as sputtering, pulsed laser deposition (PLD), electron beam evaporation, thermal evaporation, or laser molecular beam epitaxy (L-MBE), or chemical vapor deposition (CVD) such as metal organic chemical vapor deposition (MOCVD), hydride vapor phase epitaxy (HVPE), initiated chemical vapor deposition (iCVD), plasma enhanced chemical vapor deposition (PECVD), or atomic layer deposition (ALD). In the deposition methods, a proper method may be selected according to a material used so as to maximize the performance of the inorganic material layer.

The first and second electrode layers formed on the substrate may be transparent electrode layers, or reflexive electrode layers. For example, one of the first and second electrode layers may be formed as the transparent electrode layer, and the other electrode layer may be formed as the reflexive electrode layer. The transparent and reflexive electrode layers may be hole-injecting or electron-injecting electrode layers generally used in the organic electronic device. One of the transparent and reflexive electrode layers may be formed as the hole-injecting electrode layer, and the other electrode layer may be formed as the electron-injecting electrode layer.

For example, the hole-injecting electrode layer may be formed using a material having a relatively high work function, and may be optionally formed using a transparent or reflective material. For example, the hole-injecting electrode layer may include a metal having a work function of approximately 4.0 eV or more, an alloy, an electroconductive compound, or a mixture of two or more thereof. Examples of such a material may include a metal such as gold, CuI, an oxide material such as indium tin oxide (ITO), indium zinc oxide (IZO), zinc tin oxide (ZTO), aluminum- or indium-doped zinc oxide, magnesium indium oxide, nickel tungsten oxide, ZnO, $SnO_2$, or $In_2O_3$, a metal nitride such as gallium nitride, a metal selenide such as zinc selenide, or a metal sulfide such as zinc sulfide. Also, the transparent hole-injecting electrode layer may be formed using a stack of a metal thin film, such as Au, Ag, or Cu, and a high-refractive transparent material such as ZnS, $TiO_2$, or ITO.

The hole-injecting electrode layer may be formed using any means such as deposition, sputtering, chemical vapor deposition, or an electrochemical means. Also, the optionally formed electrode layer may be patterned by a known method such as photolithography, or a method using a shadow mask, and the like.

For example, the electron-injecting electrode layer may be formed using a material having a relatively low work function, and may, for example, be formed using a proper transparent or reflective material among the materials used to form the hole-injecting electrode layer, but the present application is not limited thereto. The electron-injecting electrode layer may also be formed using a method such as, for example, deposition, or sputtering, and may be properly patterned, when necessary.

The electrode layer may, for example, be formed so that the electrode layer has a thickness of approximately 90 nm to 200 nm, 90 nm to 180 nm, or approximately 90 nm to 150 nm.

An organic layer is formed between the transparent and reflexive electrode layers. According to one illustrative embodiment of the present application, the organic layer may include at least two light-emitting units. In such a configuration, light generated at the light-emitting units may be reflected by the reflexive electrode layer, and then emitted through the transparent electrode layer.

The organic layer may include at least one light-emitting unit. When necessary, the organic layer may include two light-emitting units, that is, a first light-emitting unit having a first emissive peak wavelength, and a second light-emitting unit having a second emissive peak wavelength, and may optionally include three or more light-emitting units. In the foregoing, the first emissive peak wavelength may appear within a different range than the second emissive peak wavelength. For example, the first emissive peak wavelength may be longer than the second emissive peak wavelength. For example, a ratio ($\lambda_1/\lambda_2$) of the first emissive peak wavelength ($\lambda_1$) to the second emissive peak wavelength ($\lambda_2$) may be in a range of 1.1 to 2. Within this range, desired colors may be realized by combining kinds of light emitted at the respective light-emitting units. According to another illustrative embodiment, the ratio ($\lambda_1/\lambda_2$) may be greater than or equal to 1.2, 1.3, or 1.4. According to still another illustrative embodiment, the ratio ($\lambda_1/\lambda_2$) may also be less than or equal to 1.9, or 1.85. The distance between the respective light-emitting units and the reflexive electrode layer may be adjusted in consideration of light extraction efficiency. For example, the ratio ($L_1/L_2$) of the distance ($L_1$) between the first light-emitting units and the reflexive electrode layer (for example, the reflexive electrode layer) to the distance ($L_2$) between the second light-emitting units and the reflexive electrode layer may be in a range of approximately 1.5 to 20. According to another illustrative embodiment, the ratio ($L_1/L_2$) may be greater than or equal to approximately 2, or approximately 2.5. According to still another illustrative embodiment, the ratio ($L_1/L_2$) may also be less than or equal to approximately 15. For example, the organic layer including the respective light-emitting units, which have the adjusted distances and emissive peak wavelengths as described above, may be formed on a portion of the substrate having the above-described haze value to improve light extraction efficiency of the organic electronic device.

A specific range of the distance of the emissive peak wavelength of each light-emitting unit and the reflexive electrode layer is not particularly limited as long as the distance is adjusted to satisfy the ratio ($L_1/L_2$). For example, the first emissive peak wavelength may be in a range of approximately 500 to 700 nm, and the second emissive peak wavelength may be in a range of approximately 380 to 500 nm. Also, the distance between the first light-emitting unit and the reflexive electrode layer may be in a range of 150 nm to 200 nm, and the distance between the second light-emitting unit and the reflexive electrode layer may be in a range of 20 nm to 80 nm.

For proper light emission, an intermediate electrode layer or a charge generating layer may be present between the first light-emitting unit and the second light-emitting unit. Therefore, the organic layer may have a structure in which the light-emitting units are divided by an intermediate electrode layer or a charge generating layer (CGL) which has charge generating characteristics.

A material used to constitute each of the light-emitting units is not particularly limited. Fluorescent or phosphorescent organic materials having various emissive peak wavelengths are known in the related art. A proper material may be selected from the known materials to form the light-emitting unit. Examples of the material of each of the light-emitting units may include an Alq-based material such as tris(4-methyl-8-quinolinolate)aluminum (III) (Alg3), 4-MAlq3, or Gaq3, a cyclopenadiene derivative such as C-545T($C_{26}H_{26}N_2O_2S$), DSA-amine, TBSA, BTP, PAP-NPA, spiro-FPA, $Ph_3Si(PhTDAOXD)$, or 1,2,3,4,5-pentaphenyl-1,3-cyclopentadiene (PPCP), 4,4'-bis(2,2'-diphenylyinyl)-1,1'-biphenyl (DPVBi), distyryl benzene or a derivative thereof, 4-(dicyanomethylene)-2-tert-butyl-6-(1, 1,7,7,-tetramethyljulolidyl-9-enyl)-4H-pyran (DCJTB), DDP, AAAP, NPAMLI; or a phosphorescent material such as Firpic, m-Firpic, N-Firpic, $bon_2Ir(acac)$, $(C_6)_2Ir(acac)$, $bt_2Ir(acac)$, $dp_2Ir(acac)$, $bzq_2Ir(acac)$, $bo_2Ir(acac)$, $F_2Ir(bpy)$, $F_2Ir(acac)$, $op_2Ir(acac)$, $ppy_2Ir(acac)$, $tpy_2Ir(acac)$, FIrppy (fac-tris[2-(4,5'-difluorophenyl)pyridine-C'2,N]iridium (III)), or $Btp_2Ir(acac)$(bis(2-(2'-benzo[4,5-a]thienyl)pyridinato-N,C3') iridium(acetylactonate)), but the present application is not limited thereto. Each of the light-emitting units may have a host-dopant system which include a host as the above-described material, and also include perylene, distyrylbiphenyl, DPT, quinacridone, rubrene, BTX, ABTX, or DCJTB as a dopant.

Also, each of the light-emitting units may be formed properly using a kind of an electron-accepting or electron-donating organic compound exhibiting light emission characteristics as will be described below.

The organic layer may be formed in various structures which further includes other various functional layers known in the related art as long as the organic layer includes the light-emitting units. Examples of the layer that may be included in the organic layer may include an electron injection layer, a hole blocking layer, an electron transport layer, a hole transport layer, and a hole injection layer.

For example, an electron-accepting organic compound may be used for the electron injection layer or the electron transport layer. In the foregoing, any of known compounds may be used as the electron-accepting organic compound without particular limitation. Examples of such an organic compound may include a polycyclic compound or a derivative thereof such as p-terphenyl, or quaterphenyl; a polycyclic hydrocarbon compound or a derivative thereof such as naphthalene, tetracene, pyrene, coronene, chrysene, anthracene, diphenylanthracene, naphthacene, or phenanthrene; or a heterocyclic compound or a derivative thereof such as phenanthroline, bathophenanthroline, phenanthridine, acridine, quinoline, quinoxaline, or phenazine. Also, fluoroceine, perylene, phthaloperylene, naphthaloperylene, perynone, phthaloperynone, naphthaloperynone, diphenylbutadiene, tetraphenyl butadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone, or rubrene, or derivatives thereof; metal chelate complex compounds disclosed in Japanese Patent Laid-open Publication No. 1988-295695, Japanese Patent Laid-open Publication No. 1996-22557, Japanese Patent Laid-open Publication No. 1996-81472, Japanese Patent Laid-open Publication No. 1993-009470, or Japanese Patent Laid-open Publication No. 1993-017764, for example, metal complexes, which include as a ligand at least one metal chelating oxanoid compound selected from the group consisting of 8-quinolinolato compounds such as tris(8-quinolinolato)aluminum, bis(8-quinolinolato)magnesium, bis[benzo(f)-8-quinolinolato]zinc, bis(2-methyl-8-quinolinolato)aluminum, tris(8-quinolinolato)indium, tris (5-methyl-8-quinolinolato)aluminum, 8-quinolinolatolithium, tris(5-chloro-8-quinolinolato)gallium, bis(5-chloro-8-quinolinolato)calcium, or derivatives thereof; oxadiazole compounds disclosed in Japanese Patent Laid-open Publication No. 1993-202011, Japanese Patent Laid-open Publication No. 1995-179394, Japanese Patent Laid-open Publication No. 1995-278124, or Japanese Patent Laid-open Publication No. 1995-228579; triazine compounds disclosed in Japanese Patent Laid-open Publication No. 1995-157473; stilbene derivatives or distyrylarylene derivatives disclosed in Japanese Patent Laid-open Publication No. 1994-203963; styryl derivatives disclosed in Japanese Patent Laid-open Publication No. 1994-132080, or Japanese Patent Laid-open Publication No. 1994-88072; diolefin derivatives disclosed in Japanese Patent Laid-open Publication No. 1994-100857, or Japanese Patent Laid-open Publication No. 1994-207170; a fluorescence brightening agent such as a benzooxazole compound, a benzothiazole compound, or a benzoimidazole compound; a distyrylbenzene compound such as 1,4-bis(2-methylstyryl)benzene, 1,4-bis(3-methylstyryl)benzene, 1,4-bis(4-methylstyryl) benzene, distyrylbenzene, 1,4-bis(2-ethylstyryl)benzyl, 1,4-bis(3-ethylstyryl)benzene, 1,4-bis(2-methylstyryl)-2-methylbenzene, or 1,4-bis(2-methylstyryl)-2-ethylbenzene; a distyrylpyrazine compound such as 2,5-bis(4-methylstyryl) pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine, or 2,5-bis[2-(1-pyrenyl) vinyl]pyrazine; a dimethylidine compound a derivative thereof such as 1,4-phenylenedimethylidine, 4,4'-phenylenedimethylidine, 2,5-xylenedimethylidine, 2,6-naphthylenedimethylidine, 1,4-biphenylenedimethylidine, 1,4-para-terephenylenedimethylidene, 9,10-anthracenediyldimethylidine, 4,4'-(2,2-di-t-butylphenylvinyl)biphenyl, or 4,4'-(2,2-diphenylvinyl) biphenyl; silanamine derivatives disclosed in Japanese Patent Laid-open Publication No. 1994-49079, or Japanese Patent Laid-open Publication No. 1994-293778; multifunctional styryl compounds disclosed in Japanese Patent Laid-open Publication No. 1994-279322, or Japanese Patent Laid-open Publication No. 1994-279323; oxadiazole derivatives disclosed in Japanese Patent Laid-open Publication No. 1994-107648, or Japanese Patent Laid-open Publication No. 1994-092947; anthracene compounds disclosed in Japanese Patent Laid-open Publication No. 1994-206865; oxynate derivatives disclosed in Japanese Patent Laid-open Publication No. 1994-145146; tetraphenyl butadiene compounds disclosed in Japanese Patent Laid-open Publication No. 1992-96990; trifunctional organic compounds disclosed in Japanese Patent Laid-open Publication No. 1991-296595; coumarin derivatives disclosed in Japanese Patent Laid-open Publication No. 1990-191694; perylene derivatives disclosed in Japanese Patent Laid-open Publication No. 1990-196885; naphthalene derivatives disclosed in Japanese Patent Laid-open Publication No. 1990-255789; phthaloperynone derivatives disclosed in Japanese Patent Laid-open Publication No. 1990-289676, or Japanese Patent Laid-open Publication No. 1990-88689; or styrylamine derivatives disclosed in Japanese Patent Laid-open Publication No. 1990-250292 may also be used as the electron-accepting organic compound included in the low-refractive index layer. In the foregoing, the electron injection layer may, for example, be formed using a material such as LiF, or CsF.

The hole blocking layer is a layer which prevents injected holes from entering the electron-injecting electrode layer via the light-emitting units so as to improve the lifespan and efficiency of the elements. When necessary, the hole blocking layer may be formed at a proper position between the light-emitting units and the electron-injecting electrode layer using a known material.

For example, the hole injection layer or hole transport layer may include an electron-donating organic compound. Representative examples of the electron-donating organic compound may include aryl amine compounds such as N,N',N'-tetraphenyl-4,4'-diaminophenyl, N,N'-diphenyl-N,N'-di(3-methylphenyl)-4,4'-diaminobiphenyl, 2,2-bis(4-di-p-tolylaminophenyl)propane, N,N,N',N'-tetra-p-tolyl-4,4'-diaminobiphenyl, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quadriphenyl, 4-N,N-diphenylamino-(2-diphenylvinyl) benzene, 3-methoxy-4'-N,N-diphenylaminostyrylbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tolyl)amine, 4-(di-p-tolylamino)-4'-[4-(di-p-tolylamino)styryl]stilbene, N,N,N',N'-tetraphenyl-4,4'-diaminobiphenyl N-phenylcarbazole, 4,4'-bis[N-(1-naphthyl)-N-phenyl-amino]biphenyl, 4,4"-bis[N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4"-bis[N-(1-anthryl)-N-phenylamino]-p-terphenyl, 4,4'-bis[N-(2-phenanthryl)-N-phenylamino]biphenyl, 4,4'-bis [N-(8-fluoranthenyl)-N-phenyl amino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tolylamino)naphthalene, 2,6-bis[di-(1-naphthyl)amino] naphthalene, 2,6-bis[N-(1-naphthyl)-N-(2-naphthyl)amino] naphthalene, 4,4"-bis[N,N-di(2-naphthyl)amino]terphenyl, 4,4'-bis{N-phenyl-N-[4-(1-naphthyl)phenyl] amino}biphenyl, 4,4'-bis[N-phenyl-N-(2-pyrenyl)amino]biphenyl, 2,6-bis[N,N-di-(2-naphthyl)amino]fluorine, 4,4"-bis(N,N-di-p-tolylamino)terphenyl, and bis(N-1-naphthyl)(N-2-naphthyl)amine, but the present application is not limited thereto.

The hole injection layer or the hole transport layer may be formed by dispersing an organic compound in a polymer, or may also be formed using a polymer derived from the organic compound. Also, n-conjugated polymers such as polyparaphenylene vinylene, and derivatives thereof; hole-transporting non-conjugated polymers such as poly(N-vinylcarbazole); or σ-conjugated polymers such as polysilane may be used.

The hole injection layer may be formed using a metal phthalocyanine such as copper phthalocyanine, or electrically conductive polymers such as non-metal phthalocyanine, carbon membrane, and polyaniline, or may also be formed by reacting the aryl amine compound as an oxidizing agent with a Lewis acid.

A specific structure of the organic layer is not particularly limited. Various materials for forming the hole- or electron-injecting electrode layer and the organic layer, for example, the light-emitting unit, the electron injection or transport layer, and the hole injection or transport layer, and methods of forming the layers are known in the related art. In this case, all the methods as described above may be applied to the preparation of the organic electronic device.

After such first and second electrode layers and organic layer are at least formed, when necessary, the organic electronic element may be formed on the substrate by encapsulating the formed elements with a proper encapsulation material to protect the elements.

As described above, in the present application, the structure and material of the organic electronic element formed on the flexible substrate, and the method of forming the organic electronic element are not limited to the foregoing, and may also be applied to other known contents.

After such an operation, when necessary, an operation of peeling off the flexible substrate, and the organic electronic element formed on the flexible substrate from the polymer layer may be further performed. In the present application, the flexible substrate may be formed on the polymer layer having the controlled shape as described above, and thus the substrate may be easily peeled from the carrier substrate without performing an additional operation, for example, an operation of removing an edge or adhesive component like a conventional technique.

Another aspect of the present application provides an organic electronic device. The organic electronic device according to one illustrative embodiment of the present application may be prepared using the above-described method. Therefore, the organic electronic device may include a carrier substrate; a polymer layer formed on the carrier substrate and having a convex portion and a concave portion formed in a surface thereof; a flexible substrate coming in contact with the convex portion of the polymer layer; and an organic electronic element formed on a top surface of the flexible substrate.

The specific contents of the organic electronic device may be applied in the same manner as described above.

Therefore, in the foregoing the polymer layer may include a polyorganosiloxane, for example, a polyorganosiloxane including a repeating unit represented by Formula 1.

In the foregoing, the contact ratio between the polymer layer and the flexible substrate, or the aspect ratio of the polymer layer may also be controlled within the above-described ranges.

Still another aspect of the present application provides a use of the organic electronic device, for example, an organic light-emitting device. For example, the organic light-emitting device may be effectively applied to backlights for liquid crystal display devices (LCDs), lightings, light sources for various sensors, printers or photocopiers, light sources for dashboards in vehicles, traffic lights, pilot lamps, light sources for display devices or planar light-emitting bodies, displays, decorations, or various lights. Yet another aspect of the present application provides a lighting device including the OLED. When the OLED is applied to the lighting device or other applications, the other parts constituting the lighting device, or a method of constituting the lighting device are not particularly limited. When the OLED is used, all the materials and methods known in the related art are applicable to the OLED.

Effect

The present application provides a method of preparing an organic electronic device, an organic electronic device prepared using the same, and a use thereof. In the present application, for example, the method of preparing an organic electronic device effectively using the flexible substrate, and the organic electronic device prepared using the same, and the use thereof may be provided.

DETAILED DESCRIPTION OF EMBODIMENTS

Hereinafter, referring to Examples, illustrative embodiments of the present application will be described in detail; however, the present application is not limited to the embodiments disclosed below.

Example 1

Figure 1:
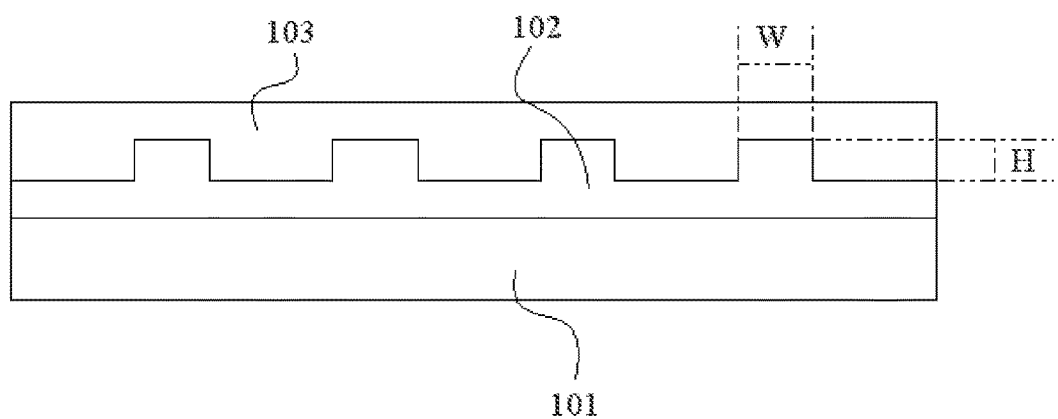
FIG. 1 is a diagram showing a method of forming a polymer layer having a convex portion on a carrier substrate according to one illustrative embodiment of the present application.
Figure 2:
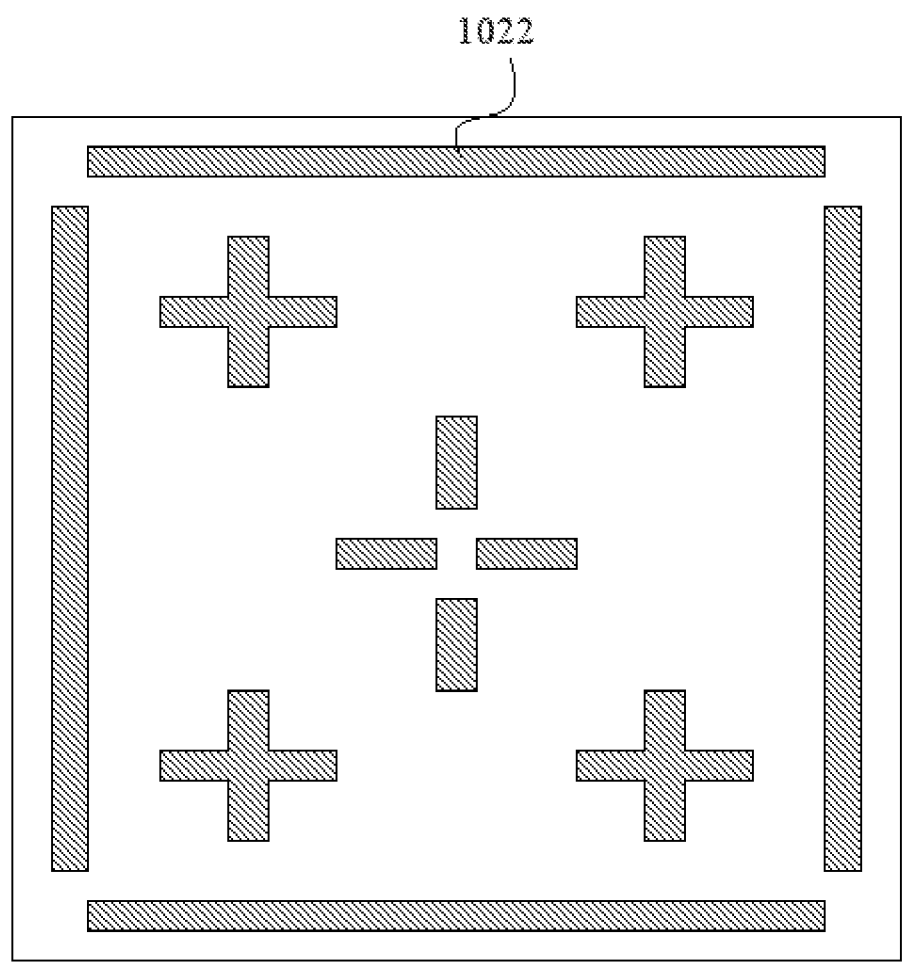
FIG. 2 is a diagram showing a configuration of the convex portion formed on the polymer layer according to one illustrative embodiment of the present application.
Figure 3:
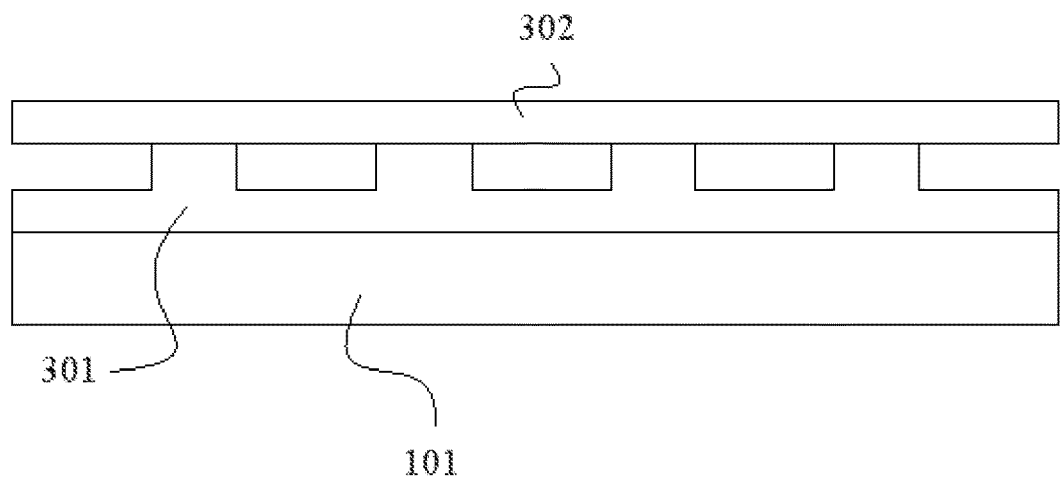
FIGS. 3 and 4 are diagrams showing a method of preparing an organic electronic device on the polymer layer according to one illustrative embodiment of the present application.
Figure 4:
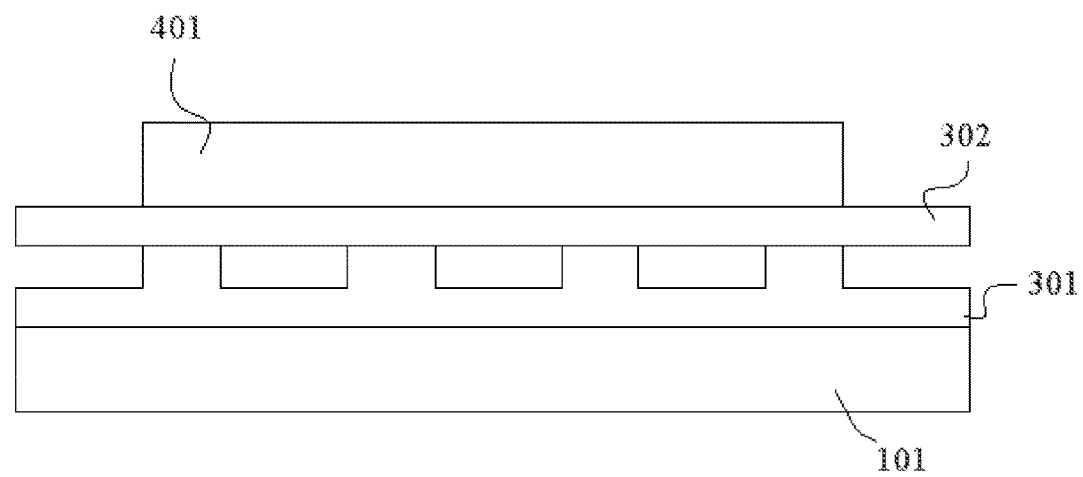

A polymer layer including polydimethylsiloxane was formed on a glass substrate that was a carrier substrate. Specifically, first of all, a layer 102 of an addition-curable silicon material capable of forming the polydimethylsiloxane was coated onto a carrier substrate 101, and a mold 103 was formed on the layer 102 of the addition-curable silicon material according to a desired shape, and the layer 102 of the addition-curable silicon material was then cured to form a polymer layer, as shown in FIG. 1. A convex portion (1022 in FIG. 2) of the polymer layer formed in this operation has a shape as shown in FIG. 2. In this case, the convex portion was formed so that an aspect ratio (W/H) of the convex portion was averagely in a range of approximately 10 to 20, a height (H) of the convex portion was averagely in a range of approximately 100 nm, and a contact area of the polymer layer with respect to a flexible substrate to be attached is in a range of approximately 30%, based on the total area of the polymer layer.

Next, a thin-film glass was disposed on the convex portion of the polymer layer to prepare an organic electronic element. In the foregoing, the preparation of the organic electronic element was performed using a known method. The organic electronic element was prepared by sequentially forming a hole-injecting transparent electrode layer, a hole transport layer, a first light-emitting unit having an emission wavelength ranging from approximately 380 to 500 nm, an n-type organic semiconductor layer, a p-type organic semiconductor layer, a second light-emitting unit having an emission wavelength ranging from approximately 500 to 700 nm, a hole blocking layer, an electron transport layer, an electron injection layer, and an electron-injecting reflexive electrode layer on the thin-film glass using the known materials, and the organic electronic device was prepared by encapsulating the organic electronic element with a proper encapsulation material. After preparation of the organic electronic device, the thin-film glass was peeled from the polymer layer. In this operation, the thin-film glass was easily peeled, and any damage of the organic electronic element was not observed during this operation.

EXPLANATION OF THE MARKS IN THE DRAWINGS

101: the carrier substrate, and the mold
102: the layer of the curable polymer composition
103: the mold
301: the polymer layer
302: the flexible substrate
401: the organic electronic element

What is claimed is:

1. A method of preparing an organic electronic device, comprising:
    forming a polymer layer having a convex portion and a concave portion formed in a surface thereof on an entire surface of a carrier substrate;
    disposing a flexible substrate on the polymer layer to come in contact with the convex portion of the polymer layer;
    forming an organic electronic element on a top surface of the flexible substrate; and
    peeling off the flexible substrate and the organic electronic element from the polymer layer.

2. The method of claim 1, wherein the polymer layer comprises polyorganosiloxane.

3. The method of claim 2, wherein the polyorganosiloxane comprises a repeating unit represented by the following Formula 1:

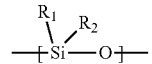

[Formula 1]

wherein $R_1$ and $R_2$ are each independently hydrogen, an alkyl group, an alkenyl group, or an aryl group.

4. The method of claim 1, wherein the convex portion of the polymer layer is formed so that a contact ratio of the convex portion of the polymer layer to the flexible substrate is in a range of 10 to 95%, based on the total area of the polymer layer.

5. The method of claim 1, wherein the convex portion of the polymer layer is formed so that an aspect ratio of the convex portion is in a range of 0.0001 to 10,000.

6. The method of claim 1, wherein the forming of polymer layer comprises:
   forming a layer of a curable polymer composition on the carrier substrate;
   bringing the layer of the curable polymer composition into contact with a mold; and
   curing the layer of the curable polymer composition brought into contact with the mold.

7. The method of claim 6, wherein the curable polymer composition is selected from the group consisting of an addition-curable silicon-based material, a condensation- or polycondensation-curable silicon-based material, a UV-curable silicon-based material, and a peroxide-vulcanized silicon-based material.

8. The method of claim 1, wherein the flexible substrate is a thin-film glass.

9. The method of claim 1, wherein the flexible substrate is a polymer film.

\* \* \* \* \*